United States Patent [19]

Sawatzki

[11] Patent Number: 5,092,557
[45] Date of Patent: Mar. 3, 1992

[54] APPARATUS FOR HOLDING AND POSITIONING A SUBSTRATE CASSETTE

[75] Inventor: Harry Sawatzki, Vaduz, Liechtenstein

[73] Assignee: Tet Techno Investment Trust Settlement, Vadux, Liechtenstein

[21] Appl. No.: 527,052

[22] Filed: May 21, 1990

[30] Foreign Application Priority Data

Mar. 5, 1990 [CH] Switzerland .................. 00687/90

[51] Int. Cl.⁵ .................................... F16M 13/00
[52] U.S. Cl. .................................. 248/542; 269/303; 269/315; 414/757
[58] Field of Search ............... 414/331, 417, 741, 757, 414/758; 294/1.1; 33/549; 104/88; 250/442.1; 248/656, 310, 346, 649, 542; 269/289 R, 291, 296, 303, 309, 315, 319, 900

[56] References Cited

U.S. PATENT DOCUMENTS

| | | | |
|---|---|---|---|
| 2,901,208 | 8/1959 | Jones | 248/346 |
| 3,799,535 | 3/1974 | Baumann | 269/309 |
| 3,977,566 | 8/1976 | Hill et al. | 414/331 X |
| 4,108,407 | 8/1978 | Cable et al. | 248/656 |
| 4,378,189 | 3/1983 | Takeshita et al. | 414/737 X |
| 4,776,744 | 10/1988 | Stonestreet et al. | 414/786 X |
| 4,781,511 | 11/1988 | Harada et al. | 414/752 X |
| 4,873,447 | 10/1989 | Imahashi | 250/442.1 X |
| 4,903,610 | 2/1990 | Matsumoto et al. | 104/88 X |
| 4,934,680 | 6/1990 | Schneider | 269/309 |
| 4,944,650 | 7/1990 | Matsumoto | 414/757 |

Primary Examiner—David L. Talbott

[57] ABSTRACT

An apparatus for holding and positioning a substrate or wafer cassette has a receiving plate which is adjustable on a three-point mounting and is lockable in its position of adjustment. The receiving plate carries runner receivers for initial guidance of a cassette onto the plate by engagement with guide runners on the cassette, and locking pins for the final location of the cassette by engagement with marginal strips on the base of the cassette.

4 Claims, 3 Drawing Sheets

APPARATUS FOR HOLDING AND POSITIONING A SUBSTRATE CASSETTE

BACKGROUND OF THE INVENTION

The invention relates to an apparatus for holding and positioning a substrate cassette, particularly a wafer cassette, in wafer processing and/or inspection devices.

Substrate cassettes serve for the transport and storage of substrates such as wafers, optical flats, hard discs etc. The substrates are held in the cassettes so that the surfaces of the substrates cannot be touched either by the cassette supporting surfaces or by substrate wafers deposited adjacent to them.

Such substrate cassettes have a wide field of application in the present-day semiconductor industry. In systems which process and/or inspect such substrate wafers, care must be taken to ensure that the substrates can be removed from the substrate cassettes without any problems and that, after processing or inspection, the substrate wafers can be automatically deposited in prepared substrate cassettes again.

In order to be able to stipulate a precisely defined position of the substrate in a processing system, it must be possible to hold the substrate cassette as precisely as possible in a simple manner in such a system, and to be able to position it if necessary, in accordance with the position aimed at. That is to say the operator of an inspection device must be able to adjust a prescribed position of a cassette as quickly as possible.

Existing substrate-cassette supports have the disadvantage that they mostly do not permit any precise positioning of the substrate cassettes. In addition, particularly in the case of substrate-cassette supports which allow substrate cassettes of different sizes to be received, it is difficult and complicated to find the basic position to be assumed.

In many substrate-cassette supports it is even possible to position the substrate cassettes wrongly which, with automatic access of an inspection system to a substrate wafer in such a cassette, may possibly lead to damage to substrate wafer and/or cassette.

In addition, the stacking frames in such substrate cassettes are generally so formed that, after having been deposited in the cassette, the substrates or wafers assume a position inclined downward towards the rear wall of the cassette in an attempt to prevent them to be held from slipping forwards out of the cassette or at least to prevent their front edges projecting out of the cassette during the transport of such substrate and/or wafer cassettes. Thus the inclined position with respect to the rear wall has entirely the desired function during transport.

On the other hand, a processing system or an inspection device should be in a position to remove automatically a wafer from such a wafer cassette once it has been detected and to process or inspect it. This means that after the wafer has been successfully detected, for example by an automatic, contactless detection system, it must be possible to travel over the surface of the wafer without any problems. This involves control engineering difficulties if, for example, the handling system has to descend continuously as it travels over the wafer, or if a robot arm of such a handling system has to penetrate into the cassette in a specific angular position, which takes up an excessive amount of space.

It is an object of the present invention to provide a holding and positioning apparatus for a substrate or wafer cassette able to achieve as simple and secure a basic positioning as possible of the cassette, and which can then bring the cassette into a preselected working position to be by systematic readjustment.

SUMMARY OF THE INVENTION

In an apparatus according to the invention, in order to receive the substrate cassette, particularly a wafer cassette, a receiving plate is provided which is connected to a multipart guide system, the receiving plate comprising two guide receivers extending perpendicular to the plate, into which are introduced base runners of the cassette to be held in the working position, and pins projecting perpendicular to the receiving plate provide lateral security and security against twisting of the cassette frame.

The above-mentioned pin locking means has, in particular, the advantage that the transverse web customarily provided on the bottom of a conventional cassette ca be simply adjusted in relation to the bottom runners, and the lateral stability can be achieved through an additional guide pin at the height of the transverse web to the exterior of the bottom guide of the cassette.

One embodiment of the invention will be described in more detail with reference to the drawings.

DESCRIPTION OF THE PREFERRED EMBODIMENT

Figure 1:
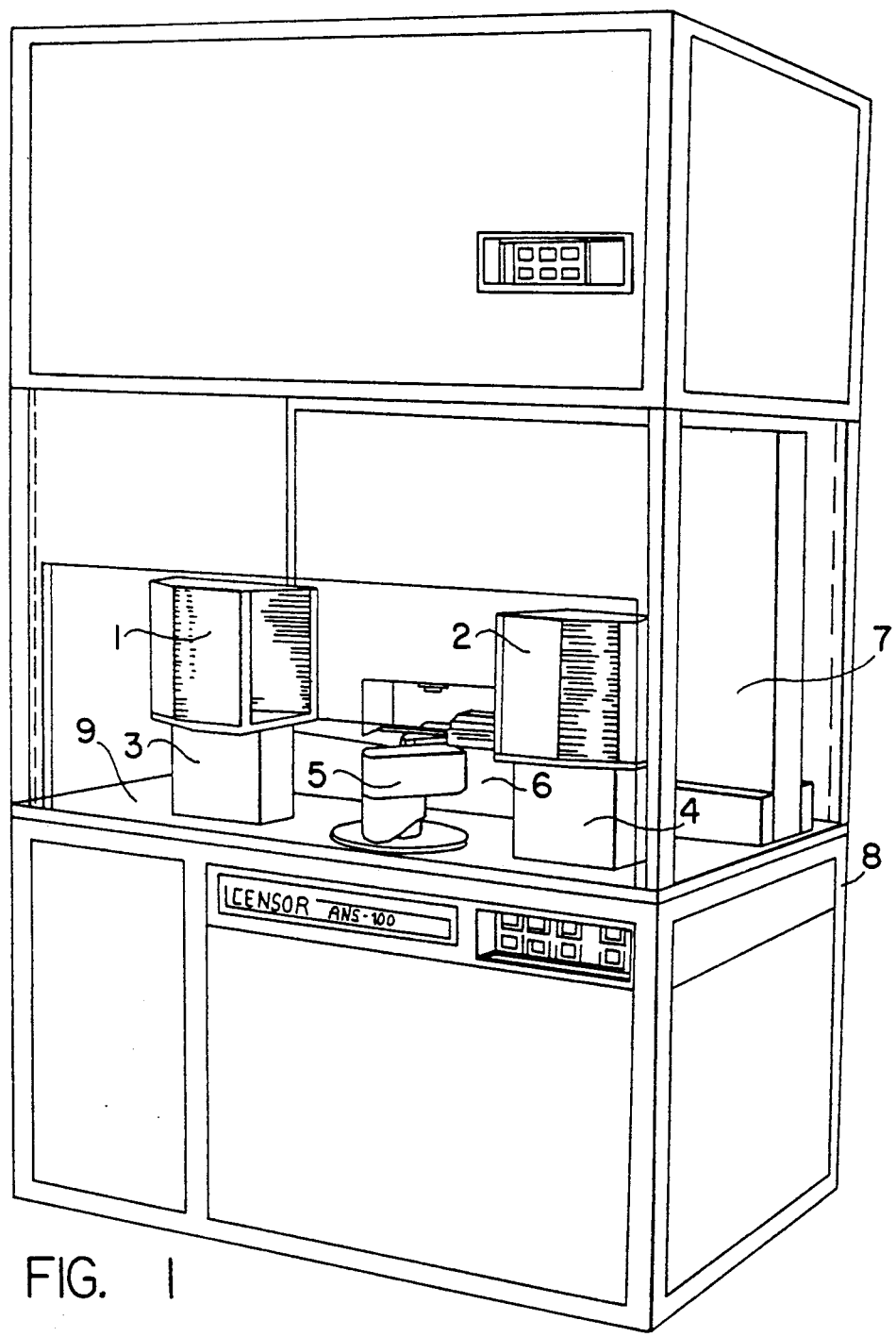
FIG. 1 shows a general illustration of a wafer inspection device with two wafer cassettes.

FIG. 1 shows a substrate surface inspection device such as is used mainly for the inspection of substrates, in particular wafers.

The inspection means itself forms no part of the present invention and will not be described as it can be entirely conventional. It is sufficient to say that apart from the smallest particles, crystal defects, metallic impurities, polishing faults, scratches, implant inhomogeneities and other effects on wafers and substrates can be made visible with such means.

The inspection device holds removably first and second wafer cassettes, 1 and 2 which are arranged standing on first and second cassette receivers 3 and 4. The device further comprises a handling robot 5 and an inspection table 6. For constructional reasons, this inspection table 6 is rigidly connected to the console 7, the table top 9 and the chassis 8. Also, in order to ensure a precise transfer of wafers, the robot 5 is aligned on the plane table 6.

The position of the first wafer cassette 1 and of the second wafer cassette 2, on the other hand, is picked up by means of appropriate measuring devices through the first and second cassette receivers 3 and 4.

Figure 3:
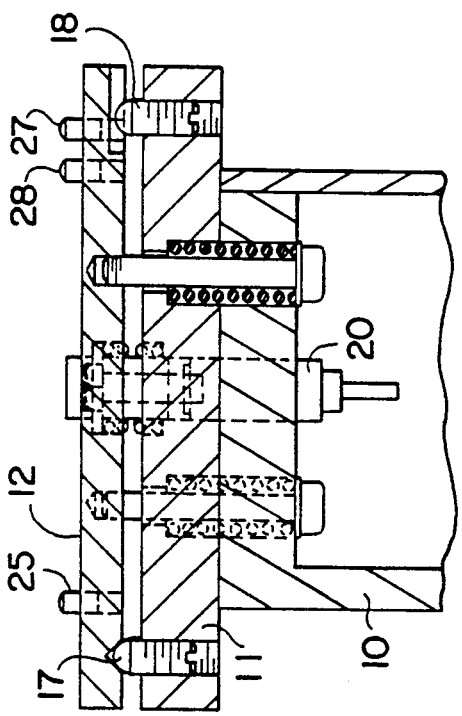
FIG. 3 is another vertical sectional view of the positioning apparatus.
Figure 2:
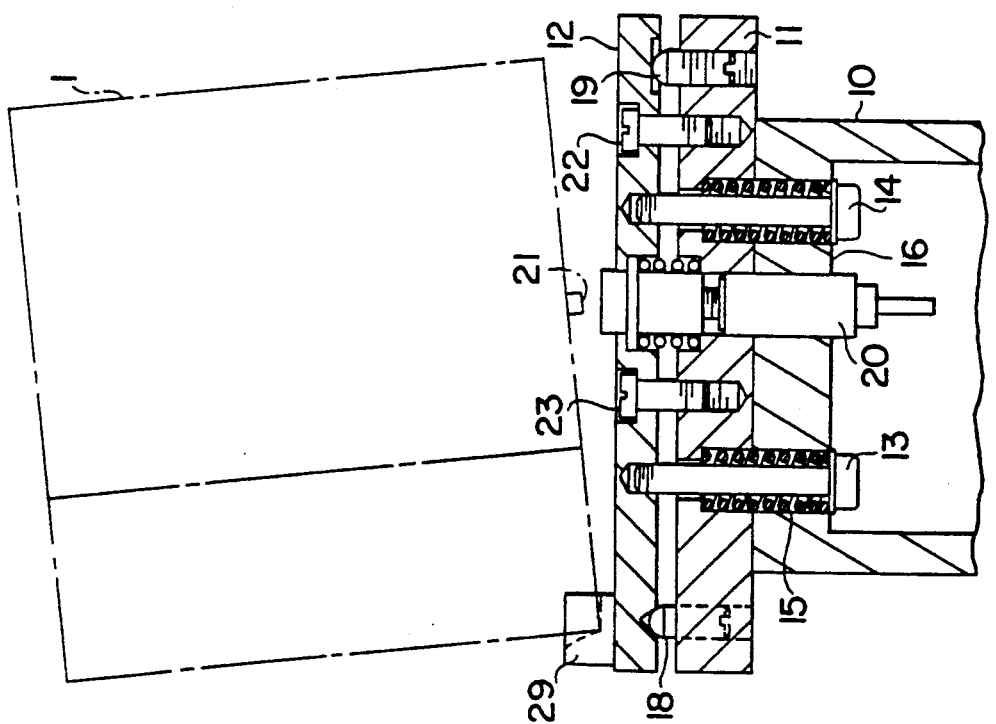
FIG. 2 is a detail illustration of a part of the device in FIG. 1 showing a wafer cassette with a vertical section of the positioning apparatus according to the invention.
Figure 4:
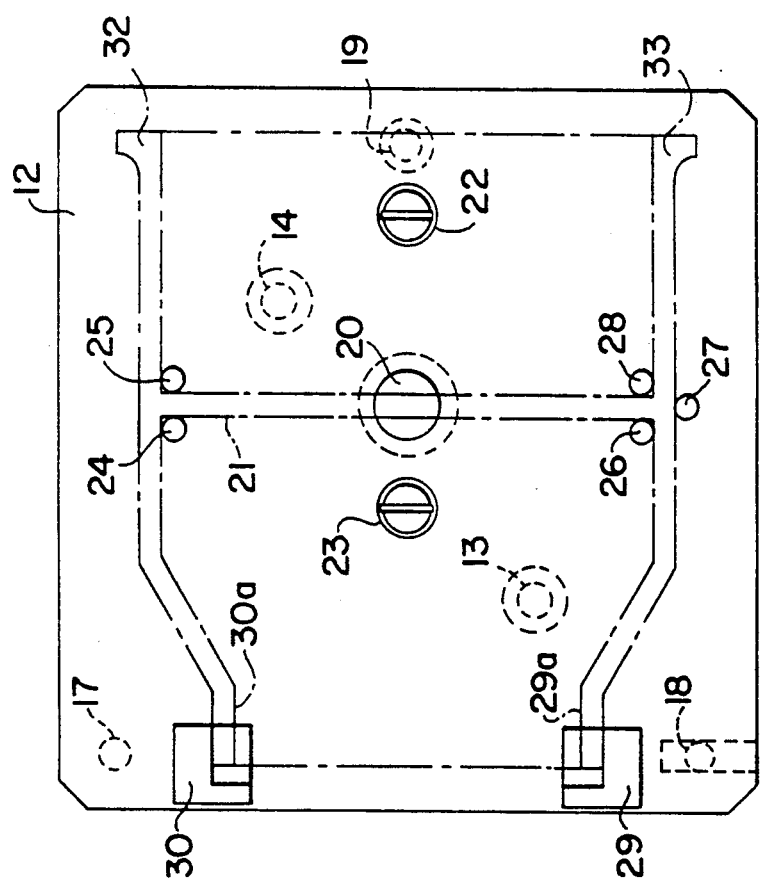
FIG. 4 is a plan view of the receiving plate of the positioning apparatus according to the invention.

FIGS. 2-4 show one adjustable cassette receiver according to the invention. The cassette receiver comprises a housing 10, a base plate 11 and a cassette receiving plate 12. The cassette receiving plate 12 is pressed by two screws 13 and 14 against adjustable, sphericaltipped supporting screws 17, 18 and 19 through the action of two springs 15 and 16. The supporting screws 17, 18 and 19 provide a kinematic mounting, one screw having its tip rotationally located, another being located in a slot with an axis radial to the rotational location and the third bearing on a planar face. By means of the screws 17, 18 and 19 bearing on the cassette receiving plate 12, the plate can be adjusted in height and levelled through adjustment of the screws.

After the adjustment, the position of the cassette receiving plate 12 is fixed by tightening the clamping screws 22 and 23. The receiving plate 12 includes a switch 20 which can be actuated by pressure from a transverse web 21 of the wafer cassette 1 to detect the positioning of the cassette. This switch is so designed that it responds to even slight lifting of the cassette 1.

The cassette 1 is guided and held at one side by three locking pins 26, 27 and 28 on plate 12 and at the other side by two locking pins 24 and 25 on plate 12 and by two runner receivers 29 and 30 on plate 12 . The runner receivers 29 and 30 are so formed that, when the cassette 1 is placed on them (FIG. 2) they give a preliminary positioning of the cassette. This is achieved as a result of the fact that the runner receivers 29 and 30 have a formation similar to a funnel shape and they are located to precisely receive guide runners 29a and 30a on the bottom of the cassette 1.

When it is set down, the cassette 1 has a position inclined slightly towards the rear. Now, the preliminary positioning by the guide runners 29a and 30a and the runner receivers 29 and 30 is such that when the cassette is tipped forward, the precise positioning of the cassette can be taken over by the locking pins 24 and 28.

When the cassette is superimposed over them, the marginal strips 32 and 33 and the transverse web 21 are used to guide the cassette 1 into the locking pins 24 to The use of three locking pins 26, 27 and 28 together with the marginal strip 33 and the transverse web 21 causes a unilateral base fixing of the wafer cassette 1.

The locking pins 24 and 25 secure the wafer cassette 1 against twisting.

I claim:

1. In combination, a substrate or wafer cassette and an apparatus for holding and positioning the cassette in a wafer processing and/or inspection device, comprising: a base on the cassette provided with guide runners and marginal strips for locating the cassette on the apparatus for holding and positioning, and a transverse web interconnecting said marginal strips, the holding and positioning apparatus including a base plate, a receiving plate supporting the cassette and disposed on said base plate and a multi-axis guide system on the receiving plate, the system including two runner receivers which project generally perpendicular to said receiving plate and into which the guide runners of the wafer cassette extend in a supported position of the cassette, and locking pins projecting perpendicularly from said plate for fixing said marginal strips and the transverse web on the base of the cassette in the supported position.

2. The combination according to claim 1, in which the multi-axis guide system includes five of said locking pins, four of said pins being disposed opposite one another in pairs in the regions between the marginal strips where the transverse web on the base of the cassette meets said marginal strips, and one locking pin being provided in the vicinity of one pair of pins adjacent to but outside of one marginal strip.

3. An apparatus according to claim 1, wherein a three-point mounting is provided on the base plate for mounting the receiving plate, said three-point mounting having a first of said pints in the form of a pivot element, a second of said points in the form of a slot element, and a third of said points in the form of a planar element.

4. An apparatus according to claim 1, wherein a cassette detecting device is located centrally of the receiving plate for detecting the presence of the cassette in the supported position.

* * * * *